United States Patent
Lee et al.

(10) Patent No.: US 11,323,962 B2
(45) Date of Patent: May 3, 2022

(54) TRANSMISSION POWER CONTROL METHOD OF BASE STATION IN OFDMA-BASED WIRELESS COMMUNICATION SYSTEM

(71) Applicant: Samsung Electronics Co., Ltd., Suwon-si (KR)

(72) Inventors: Dong Geun Lee, Hwaseong-si (KR); Young Bae Park, Suwon-si (KR); Young Kyu Choi, Incheon (KR); Ki Back Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/994,108

(22) Filed: Aug. 14, 2020

(65) Prior Publication Data

US 2020/0383051 A1 Dec. 3, 2020

Related U.S. Application Data

(62) Division of application No. 13/158,788, filed on Jun. 13, 2011.

(30) Foreign Application Priority Data

Aug. 20, 2010 (KR) .................. 10-2010-0080772
Nov. 9, 2010 (KR) .................. 10-2010-0110855

(51) Int. Cl.
  *H04W 52/02* (2009.01)
  *H03G 3/30* (2006.01)
  *H04W 88/08* (2009.01)

(52) U.S. Cl.
  CPC ...... *H04W 52/0206* (2013.01); *H03G 3/3042* (2013.01); *H04W 88/08* (2013.01); *Y02D 30/70* (2020.08)

(58) Field of Classification Search
  None
  See application file for complete search history.

(56) References Cited

U.S. PATENT DOCUMENTS

| | | | |
|---|---|---|---|
| 5,621,763 | A | 4/1997 | Walczak et al. |
| 6,329,923 | B2 | 12/2001 | Hog |

(Continued)

FOREIGN PATENT DOCUMENTS

| | | |
|---|---|---|
| CN | 1741640 A | 3/2006 |
| CN | 101409580 A | 4/2009 |

(Continued)

OTHER PUBLICATIONS

CPRI Specification V3.0, Oct. 2006, pp. 1-89. (Year: 2006).*

(Continued)

*Primary Examiner* — Nicholas Sloms
(74) *Attorney, Agent, or Firm* — Jefferson IP Law, LLP

(57) ABSTRACT

A power control method of a base station in a wireless communication system based on Orthogonal Frequency Division Multiple Access (OFDMA) is provided for reducing power consumption by turning off the bias of the power amplifier for the duration of a symbol carrying no user data. The method includes checking scheduling information of radio resources, detecting a symbol carrying no user data, based on the scheduling information, and turning off a bias of the power amplifier for a symbol duration of the symbol carrying no user data. The transmission power control method is capable of reducing power consumption of the base station by turning off the bias of the power amplifier of the base station for the symbol duration in which no user data is transmitted.

18 Claims, 9 Drawing Sheets

(56) References Cited

U.S. PATENT DOCUMENTS

| | | |
|---|---|---|
| 6,359,923 B1 | 3/2002 | Agee et al. |
| 6,480,522 B1 | 11/2002 | Hoole et al. |
| 6,535,066 B1 | 3/2003 | Petsko |
| 6,577,185 B1 | 6/2003 | Chandler et al. |
| 6,584,330 B1 | 6/2003 | Ruuska |
| 6,614,855 B1 | 9/2003 | Okamoto |
| 6,621,851 B1 | 9/2003 | Agee et al. |
| 6,782,039 B2 | 8/2004 | Alamouti et al. |
| 6,785,513 B1 | 8/2004 | Sivaprakasam |
| 6,940,827 B2 | 9/2005 | Li et al. |
| 7,061,969 B2 | 6/2006 | Alamouti et al. |
| 7,106,781 B2 | 9/2006 | Agee et al. |
| 7,120,427 B1 | 10/2006 | Adams et al. |
| 7,149,238 B2 | 12/2006 | Agee et al. |
| 7,151,759 B1 | 12/2006 | Ryan et al. |
| 7,304,969 B2 | 12/2007 | Ryan et al. |
| 7,317,750 B2 | 1/2008 | Shattil |
| 7,457,617 B2 | 11/2008 | Adams et al. |
| 7,535,297 B2 | 5/2009 | Chen et al. |
| 7,574,179 B2 | 8/2009 | Barak et al. |
| 7,620,370 B2 | 11/2009 | Barak et al. |
| 7,742,770 B2 | 6/2010 | Campbell et al. |
| 7,773,685 B2 | 8/2010 | Tirkkonen et al. |
| 7,852,812 B2 | 12/2010 | Li et al. |
| 7,961,696 B2 | 6/2011 | Ma et al. |
| 8,040,855 B2 | 10/2011 | Li et al. |
| 8,064,537 B2 | 11/2011 | Xu et al. |
| 8,081,997 B2 | 12/2011 | Sambhwani et al. |
| 8,213,527 B2 | 7/2012 | Wang et al. |
| 8,229,362 B2 | 7/2012 | Hariharan et al. |
| 8,238,318 B1 | 8/2012 | Negus |
| 8,300,533 B2 | 10/2012 | Malladi et al. |
| 8,340,676 B2 | 12/2012 | Nory et al. |
| 8,472,868 B2 | 6/2013 | Mu et al. |
| 8,527,003 B2 | 9/2013 | Gupta et al. |
| 8,588,205 B2 | 11/2013 | Chang et al. |
| 8,605,658 B2 | 12/2013 | Fujimoto |
| 8,675,588 B2 | 3/2014 | Fujishima et al. |
| 8,694,030 B2 | 4/2014 | Campbell et al. |
| 8,724,571 B2 | 5/2014 | Chung et al. |
| 8,724,574 B2 | 5/2014 | Yang et al. |
| 8,743,724 B2 | 6/2014 | Kwon et al. |
| 8,743,807 B2 | 6/2014 | Chung et al. |
| 2002/0111199 A1* | 8/2002 | Yano .......... H04W 52/0229 455/574 |
| 2004/0124916 A1 | 7/2004 | Kontson |
| 2005/0105534 A1* | 5/2005 | Osterling .......... H04W 92/12 370/395.43 |
| 2007/0037593 A1* | 2/2007 | Osterling .......... H04W 88/08 455/502 |
| 2007/0066329 A1 | 3/2007 | Laroia et al. |
| 2007/0091896 A1* | 4/2007 | Liu .......... H04J 3/1617 370/395.5 |
| 2007/0116046 A1* | 5/2007 | Liu .......... H04J 3/1617 370/466 |
| 2007/0280166 A1 | 12/2007 | Jung et al. |
| 2008/0019455 A1 | 1/2008 | Kim et al. |
| 2008/0074991 A1 | 3/2008 | Kuo et al. |
| 2008/0107161 A1 | 5/2008 | Xu et al. |
| 2008/0199183 A1* | 8/2008 | Liu .......... H04J 3/0682 398/103 |
| 2008/0205318 A1 | 8/2008 | Gupta et al. |
| 2008/0225816 A1* | 9/2008 | Osterling .......... H04J 3/0682 370/342 |
| 2008/0291857 A1* | 11/2008 | Arad .......... H04L 5/22 370/311 |
| 2009/0067377 A1* | 3/2009 | Talukdar .......... H04L 27/0008 370/329 |
| 2009/0073927 A1 | 3/2009 | Ishii et al. |
| 2009/0252108 A1* | 10/2009 | Watanabe .......... H04L 25/14 370/329 |
| 2009/0264145 A1* | 10/2009 | Kazakevich .......... H03G 3/3084 455/522 |
| 2010/0075678 A1* | 3/2010 | Akman .......... H04W 24/06 455/436 |
| 2010/0093288 A1* | 4/2010 | Pan .......... H04W 52/02 455/68 |
| 2010/0130245 A1* | 5/2010 | Iseda .......... H04L 1/0001 455/522 |
| 2010/0136932 A1* | 6/2010 | Osterling .......... H01Q 21/28 455/115.1 |
| 2010/0148745 A1 | 6/2010 | Kanou |
| 2010/0195501 A1 | 8/2010 | Tynderfeldt et al. |
| 2010/0246994 A1 | 9/2010 | Sawada |
| 2010/0317395 A1* | 12/2010 | Englund .......... H04W 52/32 455/522 |
| 2011/0014908 A1 | 1/2011 | Eiza et al. |
| 2011/0026419 A1* | 2/2011 | Kim .......... H04W 52/281 370/252 |
| 2011/0117943 A1 | 5/2011 | Chun et al. |
| 2011/0135013 A1* | 6/2011 | Wegener .......... H03M 7/40 375/241 |
| 2011/0317606 A1* | 12/2011 | Osterling .......... H04W 52/52 370/311 |
| 2012/0044845 A1 | 2/2012 | Lee et al. |
| 2012/0094661 A1 | 4/2012 | Frenger et al. |
| 2012/0170498 A1 | 7/2012 | Gustavsson et al. |
| 2013/0188531 A1 | 7/2013 | Zhang |
| 2013/0258927 A1 | 10/2013 | Frederiksen et al. |

FOREIGN PATENT DOCUMENTS

| | | |
|---|---|---|
| CN | 101420790 A | 4/2009 |
| CN | 101500298 A | 8/2009 |
| CN | 101699904 A | 4/2010 |
| CN | 101707499 A | 5/2010 |
| CN | 101715214 A | 5/2010 |
| CN | 201523456 U | 7/2010 |
| CN | 101810028 A | 8/2010 |
| JP | H05-129860 A | 5/1993 |
| JP | 2006-135417 A | 5/2006 |
| JP | 2008-172356 A | 7/2008 |
| JP | 2008-301404 A | 12/2008 |
| JP | 2009-105672 A | 5/2009 |
| JP | 2010-504703 A | 2/2010 |
| JP | 2010-177944 A | 8/2010 |
| KR | 10-2004-0027762 A | 4/2004 |
| KR | 10-2010-0013764 A | 2/2010 |
| KR | 10-2010-0080772 A | 7/2010 |
| KR | 10-1883699 B1 | 7/2018 |
| WO | 02/07464 A1 | 1/2002 |
| WO | 2009-028015 A1 | 3/2009 |
| WO | 2010-002036 A1 | 1/2010 |

OTHER PUBLICATIONS

Ferling et al., Green Radio Technologies, Dec. 2011, INFSO-ICT-247733 EARTH D4.2, pp. 1-89. (Year: 2011).*

Gruber et al., EARTH—Energy Aware Radio and NetwoRk Technologies, 2009, IEEE, pp. 1-5. (Year: 2009).*

Auer et al., Energy Efficiency Analysis of the Reference Systems, Nov. 2010, INFSO-ICT-247733 EARTH D2.3, pp. 1-68. (Year: 2010).*

Japanese Office Action dated Sep. 10, 2018, issued in Japanese Patent Application No. 2017-202983.

Chinese Office Action dated Jul. 29, 2020, issued in Chinese Application No. 201810316575.2.

Energy Efficiency, https://www.ericsson.com/en/portfolio/networks/ericsson-radio-system/radio-system-solutions/energy-efficiency, Mar. 2020.

Energy Efficiency of Radio Units and its Impact on RAN Energy Consumption, http://lup.lub.lu.se/luur/download?func-downloadFile&recordOld=8925807&fileOld=8925914, 2017.

An Energy Efficient Radio Base Station, http://lup.lub.lu.se/luur/downloadfunc=downloadFile&recordOld=8957108&fileOld=8957113, Aug. 18, 2018.

EARTH Consortium Shows the Way to 70 Percent Energy Savings on Wireless Networks http://blog.tmcnet.com/next-generation-

(56) References Cited

OTHER PUBLICATIONS communications/2012/08/earth-consortium-shows-the-way-to-70-percent-energy-savings-on-wireless-networks.html, Aug. 6, 2012.
European companies and research organizations collaborate to halve energy consumption of 4th generation wireless networks (Wed, Apr. 28, 2010), http://www.telecomkh.com/en/mobile-telephony/wireless-communications/news/news/alcatel-lucent/earth-consortium/energy-aware-radio-and-network-technologies/ericsson/1862, Apr. 28, 2010.
INFSO-ICT-247733 EARTH Deliverable D4.2 Signal Load Adaptive Transceiver System for Macro Base Station, https://cordis.europa.eu/docs/projects/cnect/247733/080/deliverables/001-EARTHWP4D42.pdf, Dec. 31, 2011.
Common Public Radio Interface: eCPRI Interface Specification, eCPRI Specification V1.1, Jan. 10, 2018.
4G/5G RAN Architecture: How a Split Can Make the Difference, Resulting split architecture https://www.ericsson.com/en/reports-and-papers/ericsson-technology-review/articles/4g5g-ran-architecture-how-a-split-can-make-the-difference, Jul. 22, 2016.
U.S. Non-Final Office Action dated Jan. 11, 2022, issued in U.S. Appl. No. 13/158,788.
U.S. Non-Final Office Action dated Nov. 12, 2021, issued in U.S. Appl. No. 16/994,056.

* cited by examiner

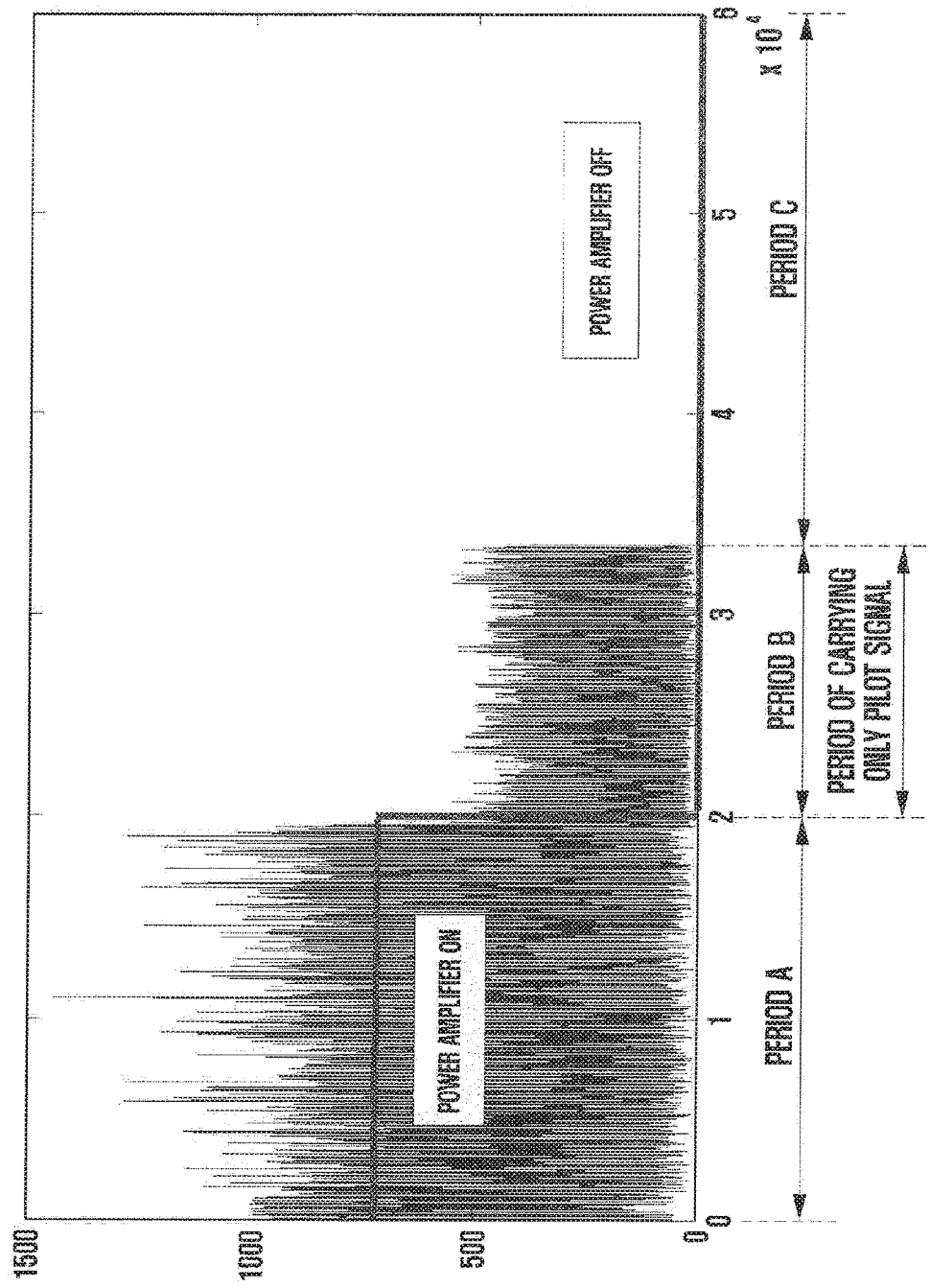

TRANSMISSION POWER CONTROL METHOD OF BASE STATION IN OFDMA-BASED WIRELESS COMMUNICATION SYSTEM

PRIORITY

This application is a divisional application of prior application Ser. No. 13/158,788, filed on Jun. 13, 2011, which claims the benefit under 35 U.S.C. § 119(a) of Korean patent applications filed on Aug. 20, 2010, in the Korean Intellectual Property Office and assigned Serial No. 10-2010-0080772, and on Nov. 9, 2010, in the Korean Intellectual Property Office and assigned Serial No. 10-2010-0110855, the entire disclosures of which are hereby incorporated by reference.

BACKGROUND OF THE INVENTION

1. Field of the Invention

The present invention relates to wireless communications. More particularly, the present invention relates to a method and apparatus for controlling power consumption of a power amplifier in a wireless communication system.

2. Description of the Related Art

Mobile communication services have evolved in recent years from basic voice communication services to advanced data communication services based on the high speed wireless communication technologies such as Worldwide Interoperability for Microwave Access (WiMAX) and Long Term Evolution (LTE). These high speed wireless communication technologies adopt OFDMA as a multiple access scheme.

In order to transmit large amounts of multimedia data in a high mobility environment, there is a need for a power amplifier that is capable of supporting an increased bandwidth of modulation signals and a high peak-to-average-power ratio. Owing to the characteristics of the data communication, the data traffic amount is likely to fluctuate abruptly according to the user's service access time and types of services.

In the meantime, there has been discussion of a Green Base Transceiver Station (BTS) and low power base station with the concern of global warming. Key concerns of the discussion are to improve the energy efficiency of a Radio Frequency (RF) power amplifier which consumes over 50% of the power of the base station, and the system optimization for rapid variation of data traffic.

There is therefore a need to develop a method for controlling the power consumption of the RF power amplifier of a base station.

SUMMARY OF THE INVENTION

An aspect of the present invention is to address at least the above-mentioned problems and/or disadvantages and to provide at least the advantages described below. Accordingly, an aspect of the present invention is to provide a transmission power control method and apparatus for the power amplifier of a base station that is capable of minimizing power consumption by controlling the power amplifier to operate in a maximum efficiency area when the Radio Frequency (RF) output power is changed according to the user data amount.

Another aspect of the present invention is to provide a transmission power control method and apparatus for the power amplifier of a base station that is capable of reducing power consumption by controlling the power on/off of the power amplifier according to the data traffic amount.

Yet another aspect of the present invention is to provide an interface for transferring user data allocation information from a digital unit to an RF unit.

In accordance with an aspect of the present invention, a method for controlling a power amplifier of a base station in a wireless communication system based on Orthogonal Frequency Division Multiple Access (OFDMA) is provided. The method includes checking scheduling information of radio resources, detecting a symbol carrying no user data based on the scheduling information, and turning off a bias of the power amplifier for a symbol duration of the symbol carrying no user data.

In accordance with another aspect of the present invention, a base station for a wireless communication system based on OFDMA is provided. The system includes a controller for acquiring information of a symbol carrying no user data by referencing scheduling information of radio resources, and an RF unit for turning off a bias applied to a power amplifier for a symbol duration of the symbol carrying no user data by referencing the symbol information provided by the controller.

In accordance with still another aspect of the present invention, a base station for a wireless communication system based on OFDMA is provided. The system includes a controller including a scheduler for assigning radio resources, and an RF unit acquiring information on a symbol carrying no user data based on transmission powers of individual symbols within a frame and for turning off a bias applied to a power amplifier for a symbol duration of the symbol carrying no user data.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 8 is a graph illustrating an on/off timing of the bias applied to the power amplifier of a base station in a wireless communication system according to an exemplary embodiment of the present invention.

Throughout the drawings, it should be noted that like reference numbers are used to depict the same or similar elements, features, and structures.

DETAILED DESCRIPTION OF EXEMPLARY EMBODIMENTS

Figure 1:
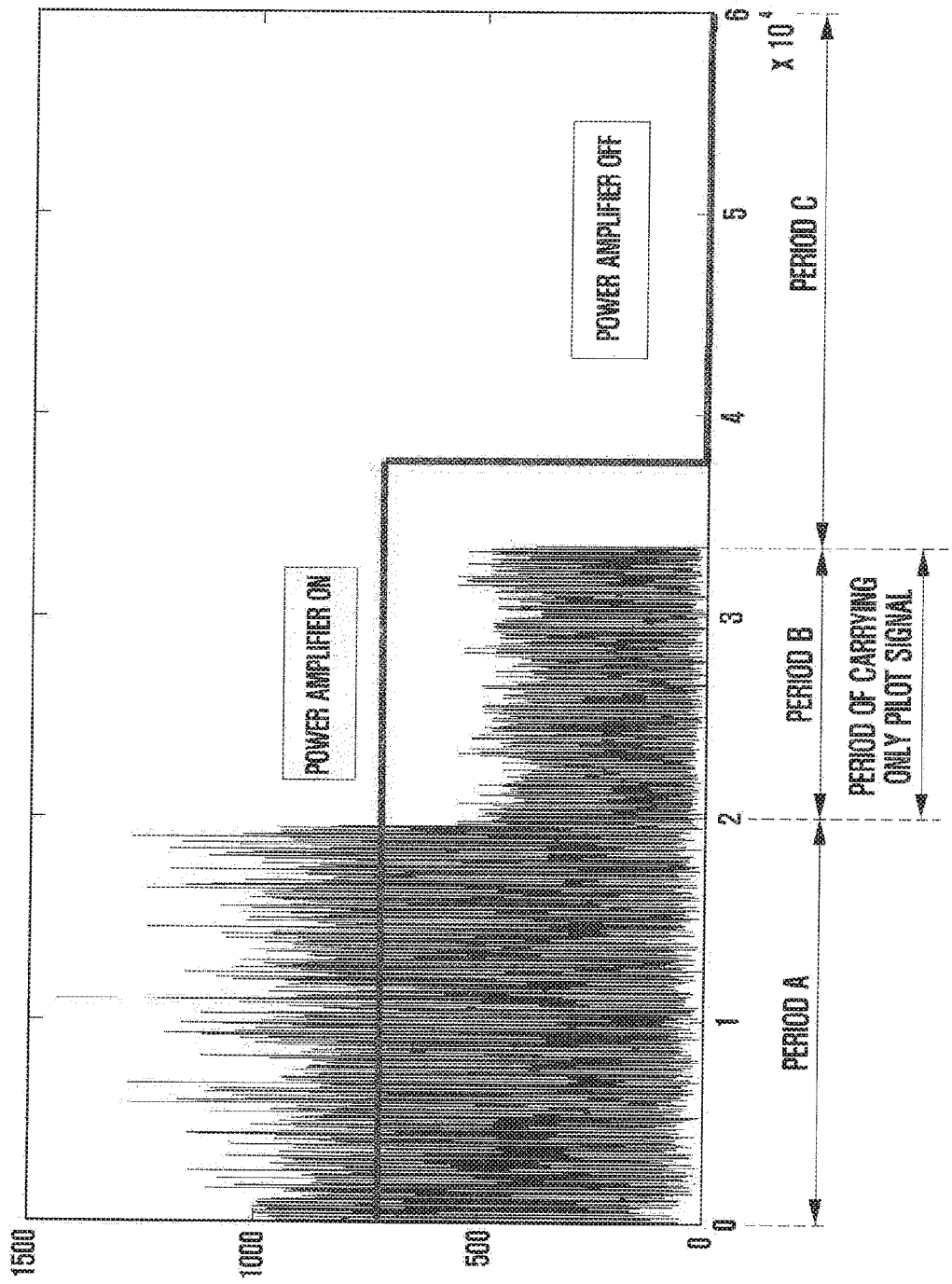
FIG. 1 is a graph illustrating on/off timing of the bias applied to the power amplifier of a base station in a Worldwide Interoperability for Microwave Access (WiMAX) system according to an exemplary embodiment of the present invention.

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the following, methods for controlling the power amplifier of a base station are described with two exemplary embodiments. In the first exemplary embodiment, a controller sends the information of the symbol carrying no data to the Radio Frequency (RF) unit such that the RF unit controls an on/off state of the power amplifier. In the second exemplary embodiment, the RF unit detects the symbol carrying no user data directly and controls the on/off state of the power amplifier based on whether it is detected that a symbol carries user data. The first exemplary embodiment also includes a method for providing an interface for transferring the symbol information from a Digital Unit (DU) (controller) to the RF unit.

In the Orthogonal Frequency Division Multiple Access (OFDMA) system, the control and data channels are assigned subcarriers in frequency domain and symbols in time domain. How to map the subcarriers and symbols to the control and data channels assigned to the mobile terminals is determined according to the type of the system and technical standard of the system. In an exemplary case of a Long Term Evolution (LTE) Advanced (LTE-A) system, a Resource Block (RB) is defined as 12 consecutive subcarriers in the frequency domain and 14 symbols in the time domain.

When mapping the user data to the RF resource assigned to the terminal, it is considered preferable to perform resource mapping in the frequency domain. In this frequency domain-preferred resource mapping scheme, the user data mapping is performed first in a symbol across entire system bandwidth and then in the next symbol. In the case of using the frequency domain-preferred resource mapping scheme, there can be symbols carrying the pilot signal but no user data. Since the pilot symbols carry no user data, it is possible to turn off the bias of the power amplifier during the pilot symbols.

FIG. 1 is a graph illustrating on/off timing of the bias applied to the power amplifier of a base station in a Worldwide Interoperability for Microwave Access (WiMAX) system according to an exemplary embodiment of the present invention. In FIG. 1, the y-axis denotes the amplitude of a signal, and the x-axis denotes time.

Referring to FIG. 1, the time axis is divided into Period A, Period B, and Period C. In Period A, the data signal and pilot signal are carried simultaneously, while only the pilot signal is carried in Period B, and no signal is carried in Period C. Of course, it is possible that no signal is carried in Period B according to scheduling information although the power amplifier is on.

In the conventional WiMAX system, the bias of the power amplifier is always on without taking into consideration the differences of the Periods A, B, and C. However, there is no need to turn on the bias for the Period B during which no data signal is transmitted. In an exemplary embodiment of the present invention, the base station controls to turn off the bias of the power amplifier for the Period B so as to reduce the power consumption of the base station.

A description is made of a method for controlling the power amplifier of a base station in exemplary embodiments hereinafter.

First Exemplary Embodiment

In an exemplary embodiment of the present invention, a controller sends the information of the symbol carrying no user data to an RF unit such that the RF unit controls an on/off state of the power amplifier based on the information.

Figure 2A:
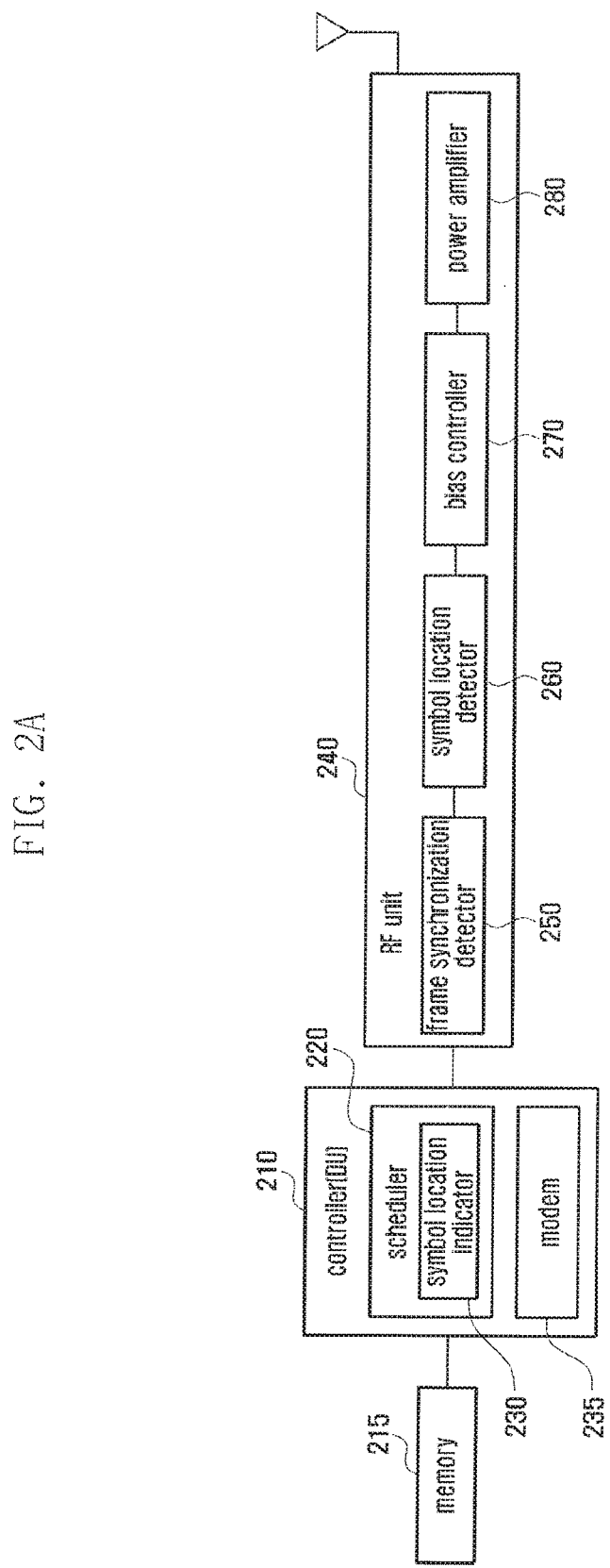
FIG. 2A is a block diagram illustrating a configuration of a base station according to an exemplary embodiment of the present invention.

FIG. 2A is a block diagram illustrating a configuration of a base station according to an exemplary embodiment of the present invention.

Referring to FIG. 2A, the base station according to this exemplary embodiment includes a controller 210 including a scheduler 220 having a symbol location indicator 230 and a modem 235, a memory 215, and an RF unit 240 including a frame synchronization detector 250, a symbol location detector 260, a bias controller 270, and a power amplifier 280.

The controller 210 controls operations of the base station for providing mobile communication services to the end user terminals. In an exemplary embodiment of the present invention, the controller 210 can be called a Digital Unit to distinguish it from the RF unit 240 responsible for the radio communication function. More particularly, in an exemplary embodiment of the present invention, the controller 210 can control signaling among the internal function blocks such that the bias of the power amplifier is turned off for the duration of the symbol carrying no user data. The controller 210 can further include the modem 235 and the scheduler 220 having the symbol location indicator 230.

The scheduler 220 performs scheduling on the control signals and user data to be transmitted to end user terminals. According to an exemplary embodiment of the present invention, the scheduler 220 performs resource scheduling in a symbol across the entire system bandwidth first, and then in the next symbol. By assigning resources in this manner, there can be at least one symbol carrying no user data.

The symbol location indicator 230 outputs non-data symbol indication information generated based on the resource assignment information provided by the scheduler 220. The non-data symbol indication information can include the symbol location information (e.g., the start point of the non-data symbol) and/or a number of non-data symbols, but is not limited to this kind of information. In an exemplary embodiment of the present invention that is described hereinafter, the symbol information can be defined as the information on the symbol to which no user data is mapped in each frame. The symbol information can be, for example, the location information (i.e., start point) on the symbol to which no user data is mapped or a number of the symbols, but is not limited thereto.

According to an exemplary embodiment of the present invention, the scheduler 220 can store the information on the symbol temporarily.

Although the description is directed to the case where the symbol location indicator 230 acquires the information on the symbol carrying no user data, the present invention is not limited thereto. According to an exemplary embodiment of the present invention, the symbol location indicator 230 can be configured to acquire the information about at least one of the symbol carrying user data and the symbol carrying no user data. That is, the symbol location indicator 230 can output the symbol information about both the symbols carrying the user data and symbols carrying no data.

Since both the scheduler 220 and the symbol location indicator 230 in this exemplary embodiment are integrated into the controller 210, the symbol location indicator 230 can acquire the scheduling information, i.e., resource assignment information, from the scheduler 220 directly. The symbol location indicator 230 sends the symbol information to the modem.

The modem 235 outputs the symbol of the baseband signal generated using a predetermined modulation and coding scheme based on the resource allocation information of the scheduler 220. Simultaneously, the modem 235 acquires the information on the symbol to which no user data is mapped and sends this information to the RF unit 240. The interface for transferring the symbol information from the modem 235 to the RF unit 240 is described later.

The RF unit 240 is responsible for processing radio signals carrying the control signal and user data transmitted to the terminals. Although not depicted in drawing, the RF unit 240 can include an RF transmitter for up-converting and amplifying transmission signals and an RF receiver for low-noise-amplifying and down-converting received signals. In FIG. 2A, only the part of the RF transmitter (Tx) is depicted. The RF unit 240 can receive the control signal and data over a radio channel, and can output the control signal and data to the controller and transmit the data input from the controller 210 over the radio channel.

In an exemplary embodiment of the present invention, the RF unit 240, particularly RF transmitter, includes the frame synchronization detector 250, the symbol location detector 260, the bias controller 270, and the power amplifier 280.

The frame synchronization detector 250 is responsible for acquiring frame synchronization and symbol synchronization.

The symbol location detector 260 detects the symbol carrying no user data in every frame to be transmitted on the basis of the symbol information provided by the controller 210. The symbol location detector 260 can also calculate the length (or duration) of the symbol carrying user data, based on the symbol information, and transfer the symbol length information to the bias controller 270.

Although the description is directed to the exemplary case where the symbol location detector 260 detects the location of the symbol carrying no user data and calculates the length of the symbol carrying the user data, the present invention is not limited thereto, but can be implemented in other embodiments with or without modifications.

According to an exemplary embodiment of the present invention, the symbol location detector 260 can be configured to detect at least one of the symbol carrying the user data and the symbol carrying no user data, and to calculate the length of each symbol.

The bias controller 270 receives the symbol length information of the symbol carrying the user data from the symbol location detector 260. The bias controller 270 can control an on/off state of the bias applied to the power amplifier 280 based on the symbol length information. In more detail, the bias controller 270 issues an ON control signal to the power amplifier 280 to power on for the symbol duration of the symbol carrying user data. Meanwhile, the bias controller 270 issues an OFF control signal to the power amplifier 280 to power off for the symbol duration of the symbol carrying no user data.

The power amplifier 280 amplifies the power of the signal (symbol) to be transmitted to the mobile terminal. More particularly, in an exemplary embodiment of the present invention, the power amplifier 280 powers on for the symbol duration of the symbol carrying user data to transmit the power-amplified signal under the control of the bias controller 270. Meanwhile, the power amplifier 280 powers off for the symbol duration of the symbol carrying no user data, resulting in no transmission.

Figure 2B:
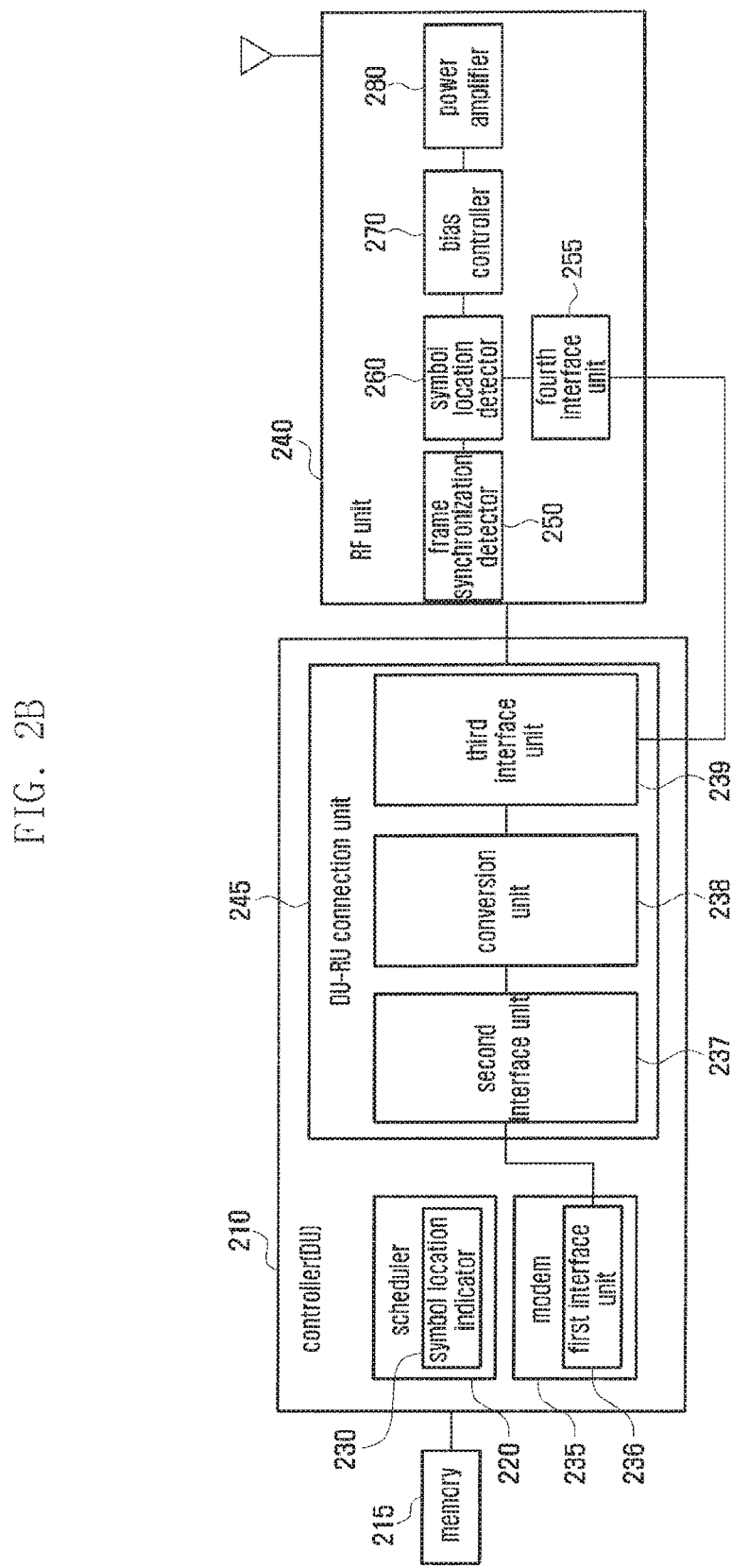
FIG. 2B is a block diagram illustrating a configuration of an interface for transferring symbol information from a controller to an RF unit in a base station according to an exemplary embodiment of the present invention.

FIG. 2B is a block diagram illustrating a configuration of an interface for transferring symbol information from a controller to an RF unit in a base station according to an exemplary embodiment of the present invention.

In the following description, the internal interface of the base station, and more particularly the interface connecting the controller 210 and the RF unit 240, follows the Common Public Radio Interface (CPRI), but is not limited thereto.

Referring to FIG. 2B, the modem 235 includes a first interface unit 236 for transferring the symbol information. The modem 235 converts the symbol information acquired from the memory 215 to the downlink subframe information (which is described later) and transfers the downlink subframe information to the DU-RF Unit (RU) connection unit 245 via the first interface unit 236. According to an exemplary embodiment of the present invention, the first and second interface units 236 and 237 connected with each other are the Automatic Data Interface Bus Interface (ADI BUS).

Figure 3:
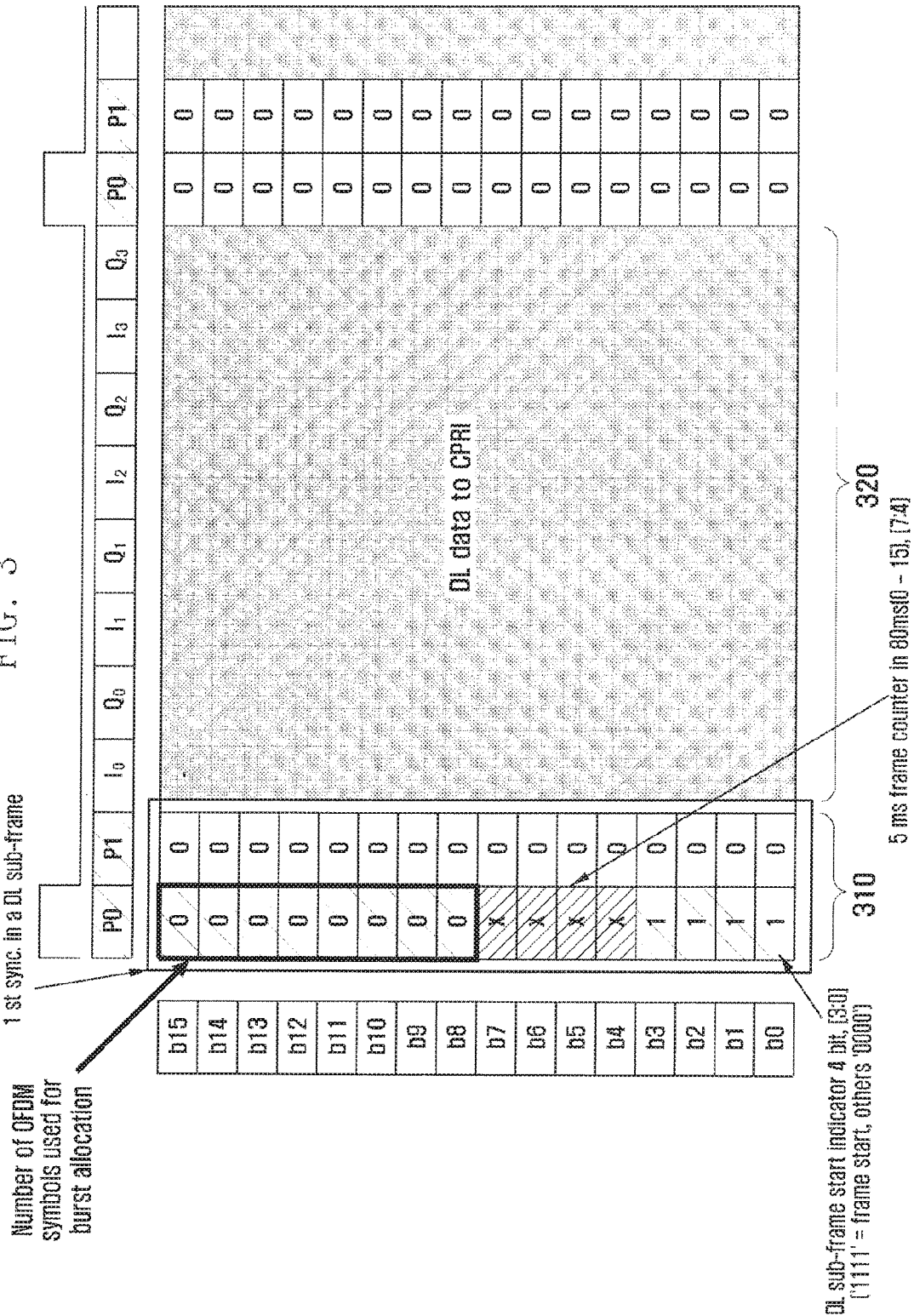
FIG. 3 is a diagram illustrating an information structure of a downlink subframe transferred to a DU-RU connector through a first interface unit according to an exemplary embodiment of the present invention.

In this case, the downlink subframe information transferred to the DU-RU connection unit 245 via the first interface unit 236 can be structured as shown in FIG. 3.

FIG. 3 is a diagram illustrating an information structure of a downlink subframe transferred to a DU-RU connector through a first interface unit according to an exemplary embodiment of the present invention Referring to FIG. 3, the downlink subframe information includes a control information region 310 indicating a start point of a downlink subframe and a data sample region 320. In this case, the four bits of b0 to b1 of the period P0 are set to '1111' as the start indicator indicating the start of the downlink subframe. Also, the eight bits of p8 to p15 of the period P0 are reserved for future use. In an exemplary embodiment of the present invention, the reserved eight bits of b8 to b15 of the period P0 as the first control signal of the control region 310 are used for the symbol information.

In the case of the Word Interoperability for Microwave Access (WiMAX) system based on the Institute of Electrical and Electronics Engineers (IEEE) 802.16e, the maximum number of the OFDM symbols constituting a downlink subframe is 35, although this varies depending on the Time Division Duplex (TDD) Symbol Ratio, and this means that the eight bits are enough to indicate the symbol information.

The DU-RU connection unit 245 establishes a connection between the controller 210 and the RF unit 240 and transfers the symbol information to the RF unit 240. For this purpose, the DU-RU unit 245 includes a second interface unit 237, a conversion unit 238, and a third interface unit 239.

The second interface unit 237 transfers the downlink subframe information received from the first interface unit 236 to the conversion unit 238.

Figure 4:
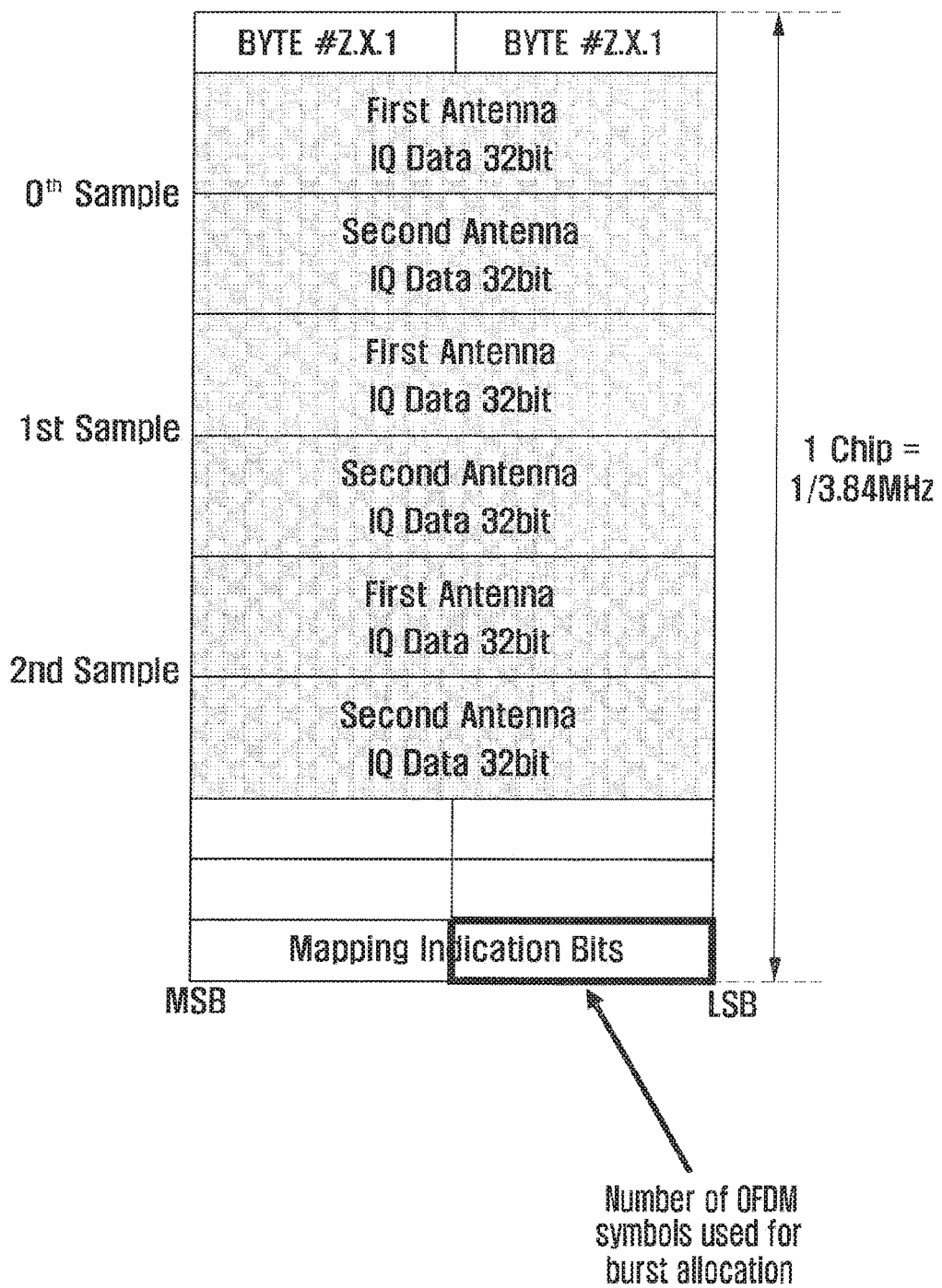
FIG. 4 is a diagram illustrating a structure of a first CPRI basic frame in downlink subframe starts according to an exemplary embodiment of the present invention.

The conversion unit 238 analyzes the received downlink subframe information to extract the symbol information and data sample. The conversion unit 238 also converts the extracted symbol information and data sample to the Basic Frame information according to the CPRI protocol. In a case of using 10 MHz channel bandwidth and dual stream 2 Transmit 2 Receive (2T2R), 35 WiMAX sample IQ data are transmitted in 12 CPRI basic frames. Particularly in the first CPRI basic frame in which the downlink subframe starts as shown in FIG. 4, only 'bit15:8' among the last 16 bits are used as the current downlink/uplink start indicator. Accordingly, the conversion unit 238 according to an exemplary embodiment of the present invention transmits the symbol information using 8 bits of 'bit7:0' which is not used among the last 16 bits of the first basic frame in which the downlink subframe starts.

The third interface unit 239 receives the basic frame information from the conversion unit 238 and outputs the basic frame information to the fourth interface unit 255. According to an exemplary embodiment of the present invention, the third and fourth interface units 239 and 255 can be the CPRI InterFaces (CPRI I/F).

The fourth interface unit 255 receives the basic frame from the third interface unit 239 and outputs the basic frame to the symbol location detector 260.

The symbol location detector 260 extracts the symbol information from the basic frame. Next, the symbol location detector 260 detects locations of the symbols to which no user data are mapped in each frame and executes the subsequent process.

Figure 5:
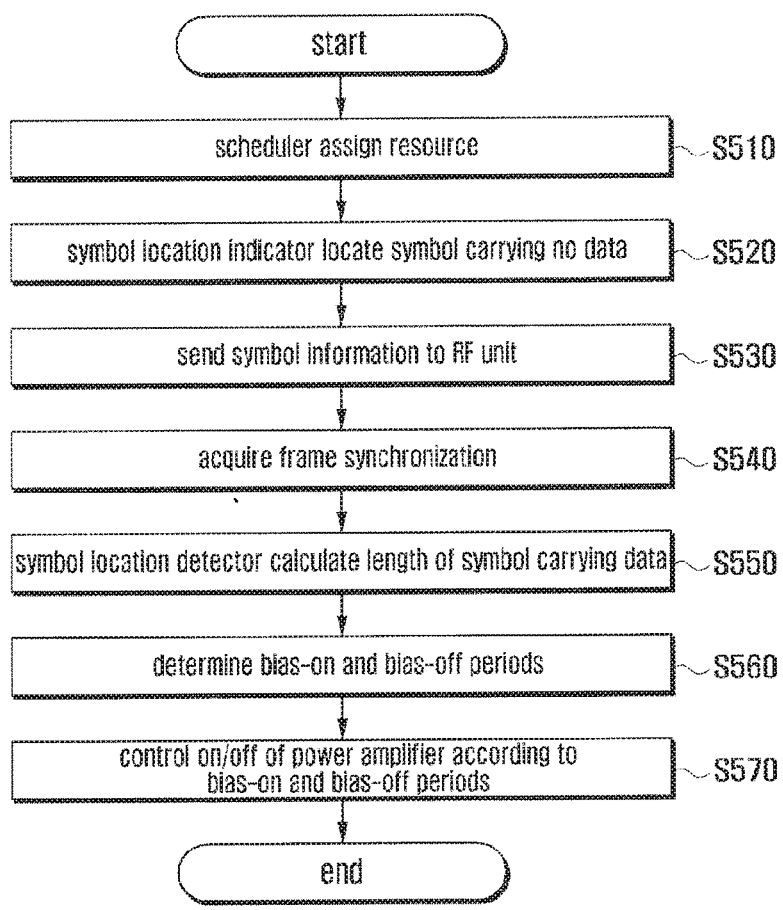
FIG. 5 is a flowchart illustrating a transmission power control method of a base station according to an exemplary embodiment of the present invention.

FIG. 5 is a flowchart illustrating a transmission power control method of a base station according to an exemplary embodiment of the present invention.

Referring to FIG. 5, the scheduler 220 performs resource assignment to end user terminals for transmitting the control signals and user data to the terminals in step S510. According to an exemplary embodiment of the present invention, the radio resource assignment process is performed such that the frequency resource is first assigned in a symbol completely, and then in the next symbol.

Next, the symbol location indicator 230 detects the location of the symbol carrying no user data in every frame in step S520. The symbol location indicator 230 sends the information on the detected symbol to the RF unit 240 in step S530. The symbol information can include location of the symbol carrying no user data and/or a number of symbols carrying no user data.

The frame synchronization detector 250 of the RF unit 240 acquires frame synchronization and symbol synchronization with the end user terminal in step S540. Next, the symbol location detector 260 detects the location of the symbol carrying no user data in every frame on the basis of the symbol information provided by the symbol location indicator 230 in step S550. At this time, the symbol location detector 260 also calculates the symbol duration (i.e., the symbol length) of the symbol carrying user data.

Next, the bias controller 270 determines a bias-on period for turning on the bias and a bias-off period for turning off the bias, on the basis of the information about the symbol carrying user data, in step S560. Here, the bias-on period is the period during which the user data is transmitted to the terminal, and the bias-off period is the period during which no user data is transmitted to the terminal.

Finally, the bias controller 270 controls the bias applied to the power amplifier, to be turned on for the bias-on period and off for the bias-off period, in step S570.

As aforementioned, the bias applied to the power amplifier is turned off for the symbol duration in which no user data is transmitted, resulting in reduction of power consumption of the power amplifier of a base station.

Second Exemplary Embodiment

In an exemplary embodiment of the present invention, the RF unit detects the symbol carrying no user data and controls the on/off state of the power amplifier based on the detection result.

Figure 6:
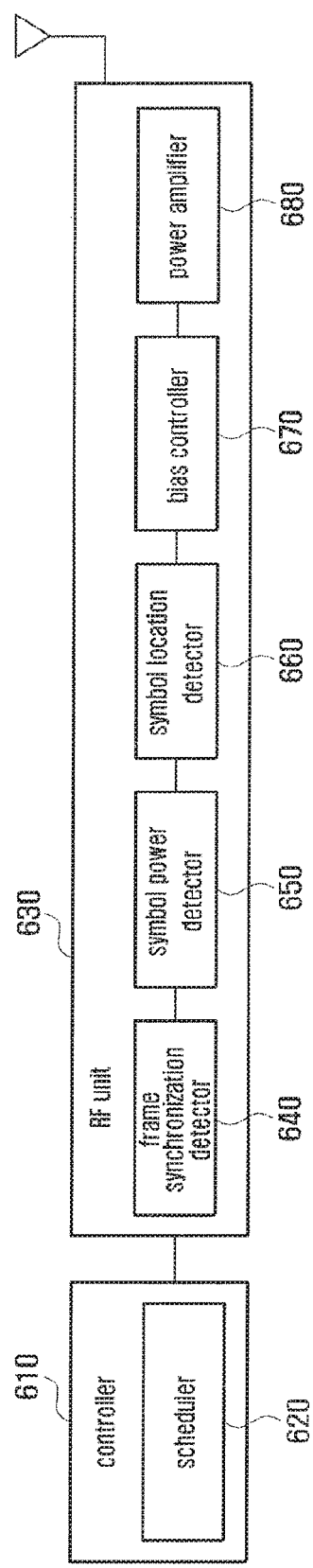
FIG. 6 is a block diagram illustrating a configuration of a base station according to an exemplary embodiment of the present invention.

FIG. 6 is a block diagram illustrating a configuration of a base station according to an exemplary embodiment of the present invention.

Referring to FIG. 6, the base station includes a controller 610 including a scheduler 620, and an RF unit 630 including a frame synchronization detector 640, a symbol power detector 650, a symbol location detector 660, a bias controller 670, and a power amplifier 680.

The controller 610 controls entire operations of the base station for providing mobile communication services to the end user terminals. As described in the exemplary embodiment above, the controller 610 can control signaling among the internal function blocks such that the bias of the power amplifier is turned off for the duration of the symbol carrying no user data. The controller 610 can further include the scheduler 620.

The scheduler 620 performs scheduling on the control signals and user data to be transmitted to the terminals. According to an exemplary embodiment of the present invention, the scheduler 620 performs resource scheduling in a symbol across the entire system bandwidth first, and then in the next symbol.

In an exemplary embodiment of the present invention, the controller 610 is basically identical with that of the exemplary embodiment described above except that the controller 610 has no function block for acquiring information about the symbol carrying no user data. According to this exemplary embodiment of the present invention, the RF unit 630 acquires the information on the symbol carrying no user data directly.

The RF unit 630 is responsible for processing radio signals carrying the control signal and user data transmitted to the terminals. Although not depicted in the drawing, the RF unit 630 can include an RF transmitter for up-converting and amplifying transmission signals and an RF receiver for low-noise-amplifying and down-converting received signals. In FIG. 6, only the part of the RF transmitter (Tx) is depicted. The RF unit 630 can receive the control signal and data over a radio channel, and can output the control signal and data to the controller and transmit the data input from the controller 610 over the radio channel.

In an exemplary embodiment of the present invention, the RF unit 630 can include the frame synchronization detector 640, the symbol power detector 650, the symbol location detector 660, the bias controller 670, and the power amplifier 680.

The frame synchronization detector 640 is responsible for acquiring frame synchronization and symbol synchronization.

The symbol power detector 650 detects the transmission powers of individual symbols in a frame. The symbol power detector 650 also acquires the information of the symbol carrying no user data based on the transmission power of the symbol. The symbol information can contain the location information about the symbol carrying no user data and/or a number of symbols carrying no user data.

The symbol location detector 660 detects the symbol carrying no user data in every frame to be transmitted on the basis of the symbol information provided by the symbol power detector 650. The symbol location detector 660 can also calculate the length (or duration) of the symbol carrying user data based on the symbol information, and transfer the symbol length information to the bias controller 670.

As described above in an exemplary embodiment of the present invention, the bias controller 670 receives the symbol length information of the symbol carrying the user data from the symbol location detector 660. The bias controller 670 can control an on/off state of the bias applied to the power amplifier 680 based on the symbol length information. In more detail, the bias controller 670 issues an ON control signal to the power amplifier 680 to power on for the symbol duration of the symbol carrying user data. Meanwhile, the bias controller 670 issues an OFF control signal to the power amplifier 680 to power off for the symbol duration of the symbol carrying no user data.

As described above in an exemplary embodiment of the present invention, the power amplifier 680 amplifies the power of the signal (symbol) to be transmitted to the mobile terminal. More particularly, in an exemplary embodiment of the present invention, the power amplifier 680 powers on for the symbol duration of the symbol carrying user data to transmit the power-amplified signal under the control of the bias controller 670. Meanwhile, the power amplifier 680 powers off for the symbol duration of the symbol carrying no user data, resulting in no transmission.

Figure 7:
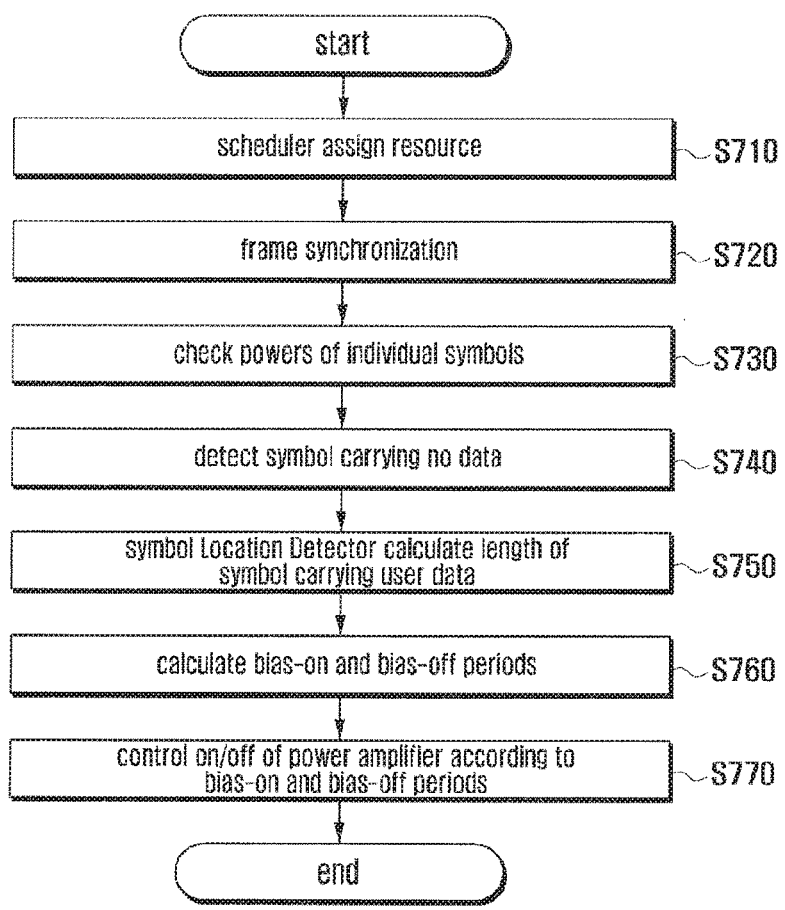
FIG. 7 is a flowchart illustrating a transmission power control method of a base station according to an exemplary embodiment of the present invention.

FIG. 7 is a flowchart illustrating a transmission power control method of a base station according to an exemplary embodiment of the present invention.

Referring to FIG. 7, the scheduler 620 performs resource assignment to end user terminals for transmitting the control signals and user data to the terminals in step S710. According to an exemplary embodiment of the present invention, the radio resource assignment process is performed such that the frequency resource is assigned in a symbol completely and then in the next symbol.

Next, the frame synchronization detector 640 of the RF unit 630 acquires frame synchronization and symbol synchronization with the terminal in step S720. After acquiring frame and symbol synchronizations, the symbol power detector 650 detects the transmission powers of the individual symbols in a frame in step S730. The symbol power detector 650 can acquire the information on the symbol carrying no user data based on the detected transmission power of each symbol, and outputs the acquired symbol information.

The symbol location indicator 660 detects the location of the symbol carrying no user data in every frame based on the symbol information provided by the symbol power detector 650 in step S740. The symbol location detector 660 also calculates the duration (i.e., the symbol length) of the symbol carrying user data in step S750.

Next, the bias controller 670 determines a bias-on period for turning on the bias and a bias-off period for turning off the bias on the basis of the information about the symbol carrying user data in step S760. Here, the bias-on period is the period during which the user data is transmitted to the terminal, and the bias-off period is the period during which no user data is transmitted to the terminal.

Finally, the bias controller 670 controls the bias applied to the power amplifier to be turned on for the bias-on period and off for the bias-off period in step S770.

FIG. 8 is a graph illustrating on/off timing of the bias applied to the power amplifier of a base station in a wireless communication system according to an exemplary embodiment of the present invention.

Referring to FIG. 8, the y-axis denotes the amplitude of a signal, and the x-axis denotes time. The time axis is divided into Period A, Period B, and Period C. In Period A, the data signal and pilot signal are carried simultaneously, while only the pilot signal is carried in Period B, and no signal is carried in Period C.

As shown in FIG. 8, the bias applied to the power amplifier turns off for the Period B in which only the pilot signal is transmitted. This means that the power control method of the present invention is capable of increasing the turn-off period of the power amplifier, resulting in a reduction of the power consumption of the power amplifier of a base station.

Table 1 shows the power saving effects in the WiMAX system using 29 symbols per frame with the power control method according to an exemplary embodiment of the present invention.

TABLE 1

| Case | Power saving |
|---|---|
| 25 symbols: bias on | |
| 25 symbols: bias off | Improvement of 4.7% in comparison to bias on |
| 21 symbols: bias on | |
| 21 symbols: bias off | Improvement of 12.5% in comparison to bias on |
| 19 symbols: bias on | |
| 19 symbols: bias off | Improvement of 15.2% in comparison to bias on |
| 17 symbols: bias on | |
| 17 symbols: bias off | Improvement of 19.3% in comparison to bias on |

Referring to the first case of Table 1, assuming a WiMAX system using 29 symbols (25 carrying user data and 4 carrying no user data), the bias of the power amplifier is turned on for the 25 symbols carrying user data and off for the 4 symbols carrying no user data, and this results in the power-saving effect of 4.7% as compare to the case where the bias of the power amplifier is turned on for all of the 29 symbols. Greater improvements of 12.5%, 15.2%, and 19.3% power savings were measured when the number of test symbols carrying user data was reduced to 21, 19, and 17, respectively.

As described above, the transmission power control method of a base station according to the present invention is capable of reducing the power consumption of the base station by turning off the bias of the power amplifier of the base station for the symbol duration in which no user data is transmitted.

While the present invention has been shown and described with reference to certain exemplary embodiments thereof, it will be understood by those skilled in the art that various changes in form and details may be made therein without departing from the spirit and scope of the invention as defined in the appended claims and their equivalents.

What is claimed is:

1. A base station in an Orthogonal Frequency Division Multiple Access (OFDMA) wireless communication system, the base station comprising:
    a digital unit; and
    a Radio Frequency (RF) unit configured to:
        receive, from the digital unit, Common Public Radio Interface (CPRI) basic frames including I/Q data samples of a first symbol and a second symbol in a sub-frame, and symbol information for the first symbol and the second symbol in the sub-frame via an interface between the digital unit and the RF unit, the symbol information for indicating that the first symbol does not include data and that the second symbol includes data without informing of a power level for a power amplifier to transmit the first symbol or second symbol in the sub-frame,
        based on the received symbol information, identify whether each of the first symbol and the second symbol includes data,
        based on identifying that the first symbol does not include data, control to enable a bias applied to the power amplifier to be turned off in a duration of the first symbol in the sub-frame, and
        based on identifying that the second symbol includes data, control to enable the bias applied to the power amplifier to be turned on in a duration of transmitting of signals corresponding to I/Q data samples of the second symbol in the sub-frame,
    wherein the I/Q data samples of the first symbol and the I/Q data samples of the second symbol are included in the CPRI basic frames among a plurality of CPRI basic frames for the sub-frame, and
    wherein the RF unit is configured to enable the bias applied to the power amplifier to be turned on and turned off within the same sub-frame.

2. The base station of claim 1, wherein the digital unit is further configured to generate the symbol information based on identification result of the first symbol not including data and identification result of the second symbol including data.

3. The base station of claim 1, wherein the symbol information includes at least one of:
    a position of the first symbol respective to the sub-frame, or
    a number of symbols not including data.

4. The base station of claim 3, wherein the RF unit is further configured to determine a start time of turning-off of the bias of the power amplifier based on the position of the first symbol in the sub-frame.

5. The base station of claim 3, wherein the RF unit is further configured to determine duration of turning-off of the bias of the power amplifier based on the number of the symbols not including data.

6. The base station of claim 1, wherein the received symbol information is in control signal received from the digital unit via the interface.

7. The base station of claim 1, wherein the digital unit is further configured to identify that the first symbol does not include data based on schedule information provided by a scheduler included in the digital unit.

8. The base station of claim 7, wherein the schedule information includes resource assignment information and the digital unit is further configured to identify that the first symbol does not include data based on the resource assignment information.

9. The base station of claim 1, wherein the symbol information includes bit information included in a specific position of a CPRI basic frame.

10. The base station of claim 1, wherein the RF unit is further configured to identify the symbol information in a first CPRI basic frame for the sub-frame.

11. A method for controlling a power amplifier of a base station in an Orthogonal Frequency Division Multiple Access (OFDMA) wireless communication system, the method comprising:
    receiving, from a digital unit, Common Public Radio Interface (CPRI) basic frames including I/Q data samples of a first symbol and a second symbol in a sub-frame, and symbol information for the first symbol and the second symbol in the sub-frame via an interface between the digital unit and a Radio Frequency (RF) unit, the symbol information for indicating that the first symbol does not include data and that the second symbol includes data without informing of a power level for a power amplifier to transmit the first symbol or second symbol in the sub-frame;
    based on the received symbol information, identifying, by the RF unit, whether each of the first symbol and the second symbol includes data;
    based on identifying that the first symbol does not include data, controlling, by the RF unit, to enable a bias applied to the power amplifier to be turned off in a duration of the first symbol in the sub-frame; and
    based on identifying that the second symbol includes data, controlling, by the RF unit, to enable the bias applied to the power amplifier to be turned on in a duration of transmitting of signals corresponding to I/Q data samples of the second symbol in the sub-frame,
    wherein the I/Q data samples of the first symbol and the I/Q data samples of the second symbol are included in the CPRI basic frames among a plurality of CPRI basic frames for the sub-frame, and
    wherein the RF unit is configured to enable the bias applied to the power amplifier to be turned on and turned off within the same sub-frame.

12. The method of claim 11, further comprising:
    generating, by the digital unit, the symbol information based on identification result of the first symbol not including data and identification result of the second symbol including data.

13. The method of claim 11, wherein the symbol information includes at least one of:
    a position of the first symbol respective to the sub-frame, or
    a number of symbols not including data.

14. The method of claim 13, further comprising:
    determining, by the RF unit, a start time of turning-off of the bias of the power amplifier based on the position of the first symbol in the sub-frame.

15. The method of claim 13, further comprising:
 determining, by the RF unit, duration of turning-off of the bias of the power amplifier based on the number of the symbols not including data.

16. The method of claim 11, wherein the received symbol information is in control signal received from the digital unit via the interface.

17. The method of claim 11, wherein the symbol information includes bit information included in a specific position of a CPRI basic frame.

18. The method of claim 11, wherein the receiving the symbol information regarding the first symbol and the second symbol comprises identifying the symbol information in a first CPRI basic frame for the sub-frame.

\* \* \* \* \*